(12) United States Patent
Clevenger et al.

(10) Patent No.: US 8,574,950 B2
(45) Date of Patent: Nov. 5, 2013

(54) ELECTRICALLY CONTACTABLE GRIDS MANUFACTURE

(75) Inventors: Lawrence A. Clevenger, Austin, TX (US); Rainer K. Krause, Austin, TX (US); Zhengwen O. Li, Austin, TX (US); Kevin S. Petrarca, Austin, TX (US); Roger A. Quon, Austin, TX (US); Carl Radens, Austin, TX (US); Brian C. Sapp, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 304 days.

(21) Appl. No.: 12/915,985

(22) Filed: Oct. 29, 2010

(65) Prior Publication Data

US 2011/0100453 A1 May 5, 2011

(30) Foreign Application Priority Data

Oct. 30, 2009 (EP) .................................. 09174559

(51) Int. Cl.
*H01L 21/44* (2006.01)

(52) U.S. Cl.
USPC ........................................... 438/98; 136/256

(58) Field of Classification Search
USPC .................................................... 438/57, 98
See application file for complete search history.

(56) References Cited

U.S. PATENT DOCUMENTS

| | | | | |
|---|---|---|---|---|
| 3,922,774 A * | 12/1975 | Lindmayer et al. | ............. | 438/72 |
| 4,152,824 A * | 5/1979 | Gonsiorawski | .................. | 438/98 |
| 4,451,969 A * | 6/1984 | Chaudhuri | ...................... | 438/62 |
| 4,612,698 A * | 9/1986 | Gonsiorawski et al. | ......... | 438/72 |
| 4,751,191 A * | 6/1988 | Gonsiorawski et al. | ......... | 438/72 |
| 5,011,565 A * | 4/1991 | Dube et al. | ....................... | 438/98 |
| 5,011,567 A * | 4/1991 | Gonsiorawski | .................. | 438/98 |
| 5,310,580 A | 5/1994 | O'Sullivan et al. | | |
| 5,320,684 A * | 6/1994 | Amick et al. | ................... | 136/256 |
| 6,291,332 B1 | 9/2001 | Yu et al. | | |
| 6,420,258 B1 | 7/2002 | Chen et al. | | |
| 6,565,763 B1 | 5/2003 | Asakawa et al. | | |
| 6,579,463 B1 * | 6/2003 | Winningham et al. | ......... | 216/41 |
| 7,001,710 B2 * | 2/2006 | Choi et al. | ...................... | 430/296 |
| 7,419,891 B1 * | 9/2008 | Chen et al. | ..................... | 438/496 |
| 7,553,760 B2 * | 6/2009 | Yang et al. | ..................... | 438/637 |
| 7,767,265 B2 * | 8/2010 | Yoshida et al. | ............ | 427/374.1 |
| 7,976,715 B2 * | 7/2011 | Dobisz et al. | ................... | 216/11 |
| 8,039,056 B2 * | 10/2011 | Hasegawa et al. | ............ | 427/264 |

(Continued)

OTHER PUBLICATIONS

S. Shoda et al., "Fabrication of nanoparticle array structure using amphiphilic diblock copolymer nano-template," Polymer Preprints, Japan, vol. 54, No. 2, year 2005 (translation of abstract provided).

(Continued)

*Primary Examiner* — David Vu
*Assistant Examiner* — Earl Taylor
(74) *Attorney, Agent, or Firm* — Steven Bennett

(57) ABSTRACT

A method for manufacturing one or more electrically contactable grids on at least one surface of a semiconductor substrate for use in a solar cell product includes the following. A heat-sensitive masking agent layer is deposited on the surface of the substrate of the solar cell product. The masking agent layer is locally heated to form a grid mask. Selected parts of the masking agent layer defined by locally heating are removed to form openings in the grid mask. A contact metallization is applied on the grid mask.

18 Claims, 8 Drawing Sheets

(56) References Cited

U.S. PATENT DOCUMENTS

| | | | |
|---|---|---|---|
| 8,039,292 B2* | 10/2011 | Guha et al. | 438/98 |
| 8,043,520 B2* | 10/2011 | Asakawa et al. | 216/56 |
| 8,101,964 B2* | 1/2012 | Kitagawa et al. | 257/99 |
| 8,114,573 B2* | 2/2012 | Sandhu et al. | 430/270.1 |
| 8,222,154 B2* | 7/2012 | Doris et al. | 438/705 |
| 8,236,604 B2* | 8/2012 | Schultz-Wittmann et al. | 438/98 |
| 8,287,749 B2* | 10/2012 | Hasegawa et al. | 216/41 |
| 2006/0134556 A1* | 6/2006 | Nealey et al. | 430/311 |
| 2007/0049047 A1* | 3/2007 | Fujimoto et al. | 438/759 |
| 2008/0093743 A1* | 4/2008 | Yang et al. | 257/758 |
| 2008/0176767 A1* | 7/2008 | Millward | 506/20 |
| 2008/0290067 A1* | 11/2008 | Yoshida et al. | 216/49 |
| 2009/0139868 A1* | 6/2009 | Shrader et al. | 205/118 |
| 2009/0142880 A1* | 6/2009 | Weidman et al. | 438/98 |
| 2009/0155725 A1* | 6/2009 | Yi et al. | 430/312 |
| 2009/0162972 A1* | 6/2009 | Xu et al. | 438/98 |
| 2009/0179001 A1* | 7/2009 | Cheng et al. | 216/41 |
| 2009/0184374 A1 | 7/2009 | Clevenger et al. | |
| 2009/0191713 A1 | 7/2009 | Yoon et al. | |
| 2009/0239086 A1* | 9/2009 | Ishizuka et al. | 428/447 |
| 2009/0269558 A1* | 10/2009 | Himmelhaus et al. | 428/195.1 |
| 2010/0003473 A1* | 1/2010 | Nishimaki | 428/195.1 |
| 2010/0155690 A1* | 6/2010 | Napolitano et al. | 257/5 |
| 2010/0159214 A1* | 6/2010 | Hasegawa et al. | 428/195.1 |
| 2010/0203732 A1* | 8/2010 | Doris et al. | 438/694 |
| 2010/0218815 A1* | 9/2010 | Guha et al. | 136/256 |
| 2010/0317148 A1* | 12/2010 | Clevenger et al. | 438/98 |
| 2011/0039061 A1* | 2/2011 | Fedynyshyn et al. | 428/119 |
| 2011/0084397 A1* | 4/2011 | Lung | 257/774 |
| 2011/0100453 A1* | 5/2011 | Clevenger et al. | 136/256 |
| 2011/0143095 A1* | 6/2011 | Tada et al. | 428/156 |
| 2011/0162703 A1* | 7/2011 | Adibi et al. | 136/256 |
| 2012/0207940 A1* | 8/2012 | Muramatsu et al. | 427/510 |
| 2012/0223053 A1* | 9/2012 | Millward et al. | 216/55 |
| 2012/0263915 A1* | 10/2012 | Millward | 428/120 |

OTHER PUBLICATIONS

D. Shahrjerdi et al., "Fabrication of self-assembled Ni nanocrystal flash memories using a polymeric template," 64th IEEE Device Research Conference Digest, p. 269-270, 2006.

* cited by examiner

ELECTRICALLY CONTACTABLE GRIDS MANUFACTURE

RELATED APPLICATIONS

The present patent application claims priority to the previously filed and presently pending European patent application entitled, "method and device for manufacturing of electrically contactable grids," filed on Oct. 30, 2009, and assigned European Patent Office (EPO) patent application number 09174559.6.

FIELD OF THE INVENTION

The present invention relates generally to a solar cell product, and more particularly to manufacturing electrically contactable grids on a semiconductor substrate for use in such a solar cell product.

BACKGROUND OF THE INVENTION

Solar cell products convert light energy, such as that from the sun, to electrical energy. Solar cell products usually include a semiconductor substrate, such as a silicon substrate with a photoactive p-n junction, a front surface covered with a contacting grid having stripes and finger-like structures, and a back contacting surface covering the entire back of the solar cell. An antireflection coating can also be provided on the front surface of the solar cell reducing reflection of light for enhancing solar cell efficiency.

In general, solar cell products are equipped with a silicon substrate of monocrystalline or polycrystalline material which is cut into wafers, typically with side lengths of 125 to 156 millimeters or to round wafers having 150 to 200 millimeters of diameter. Main process steps of solar cell production include preparing of the p-n junction, where the substrate may be doped with p-type dopants, by doping with appropriate doping material, and contacting of the photovoltaic cell. Contacting of the photovoltaic cell can include covering the front surface with an electrically contactable grid and the back surface with a contact metallization. As such, configuration of metallic electrodes on the substrate's surface can be important to provide a good electronic contact and for a high power efficiency. For instance, small dimensions of metallic stripes and fingers for the front surface contacting grid reduce shadowing effects and enlarge areas of photovoltaic active regions of the solar cell.

Current structuring techniques for providing electrically contactable grids use a silver paste screen printing technique followed by a high temperature firing process. The firing process can cause some damage to the solar device due to excessive heating, however. Alternatively, a lithography masking technique for structuring a substrate method based on a stamping technology can be employed.

SUMMARY OF THE INVENTION

A method of an embodiment of the invention is for manufacturing one or more electrically contactable grids on at least one surface of a semiconductor substrate for use in a solar cell product. The method includes depositing a heat-sensitive masking agent layer on the surface of the substrate of the solar cell product. The method includes locally heating the masking agent layer to form a grid mask. The method includes removing selected parts of the masking agent layer defined by local heating to form openings in the grid mask. The method includes applying contact metallization on the grid mask.

A solar cell product of an embodiment of the invention includes a semiconductor substrate. The solar cell product also includes an electrically contactable grid on at least one side of the substrate. The electrically contactable grid is adapted to formation by depositing a heat-sensitive masking agent layer on a surface of the substrate, locally heating the masking agent layer to form a grid mask, removing selected parts of the masking agent layer defined by local heating to form openings in the grid mask, and applying contact metallization on the grid mask.

A method of another embodiment of the invention is also for manufacturing one or more electrically contactable grids on at least one surface of a semiconductor substrate for use in a solar cell product. The method includes depositing a heat-sensitive masking agent layer on the surface of the substrate of the solar cell product. The method includes locally heating the masking agent layer to form a grid mask. The method includes removing selected parts of the masking agent layer defined by local heating to form openings in the grid mask. The method includes applying contact metallization on the grid mask. The method also includes one of the following: depositing an antireflective layer on the surface of the substrate; depositing a conductive layer on the surface of the substrate; and, depositing a conductive layer on an antireflective layer deposited on the surface of the substrate. The masking agent includes a copolymer comprising two or more immiscible polymeric block components which can be separated into self assembled phases by heating. The copolymer is a block copolymer comprising at least a first and a second polymeric block component A and B being immiscible with each other such that the block copolymer contains any numbers of the polymeric block components A and B arranged in any manner.

BRIEF DESCRIPTION OF THE SEVERAL VIEWS OF THE DRAWINGS

The drawings referenced herein form a part of the specification. Features shown in the drawing are meant as illustrative of only some embodiments of the invention, and not of all embodiments of the invention, unless otherwise explicitly indicated, and implications to the contrary are otherwise not to be made.

DETAILED DESCRIPTION

Figures 1A, 1B:
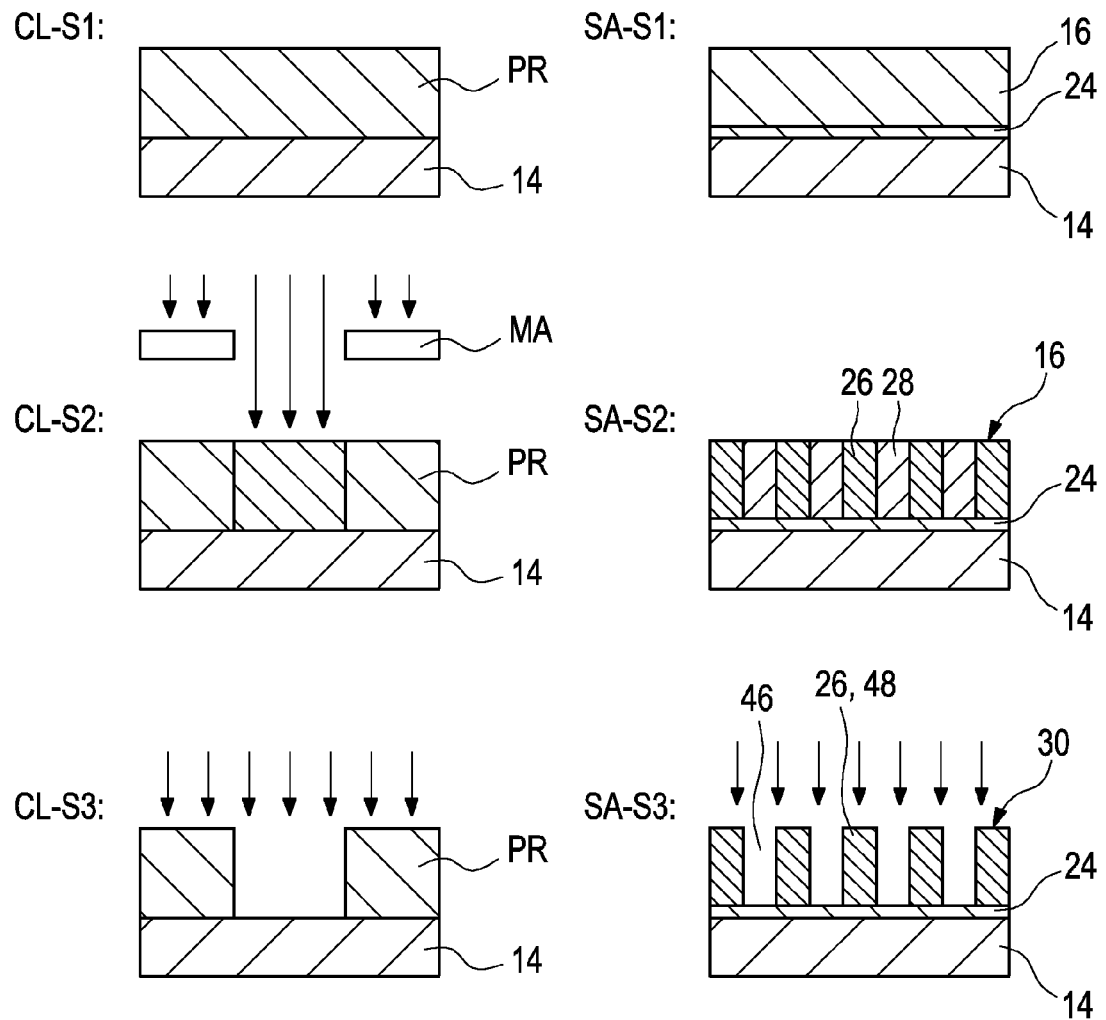
FIGS. 1a and 1b are diagrams schematically depicting a comparative sequence of sub-steps of a prior art method, in FIG. 1a, and sub-steps of a method of an embodiment of the invention, in FIG. 1b.

In the following detailed description of exemplary embodiments of the invention, reference is made to the accompanying drawings that form a part hereof, and in which is shown by way of illustration specific exemplary embodiments in which the invention may be practiced. These embodiments are described in sufficient detail to enable those skilled in the art to practice the invention. Other embodiments may be utilized, and logical, mechanical, and other changes may be made without departing from the spirit or scope of the present invention. The following detailed description is, therefore, not to be taken in a limiting sense, and the scope of the embodiment of the invention is defined only by the appended claims.

Embodiments of the invention provide a solar cell product which can be manufactured cost competitive with high quality and efficiency. As such, embodiments of the invention provide a method for manufacturing a solar cell product. A method of one embodiment of the invention is for manufacturing one or more electrically contactable grids on at least one surface of a semiconductor substrate for use in a solar cell product. The method includes depositing a heat-sensitive masking agent layer on the surface of the substrate, and locally heating of the masking agent layer to form a grid mask. The method also includes removing selected parts of the masking agent layer defined by locally heating to form openings in the grid mask, and applying contact metallization on the grid mask.

A semiconductor substrate of one embodiment is coated by a heat-sensitive masking agent layer. A structure is stamped into the masking agent layer by selectively locally heating of the masking agent layer to form a grid mask. As such, grid sizing is determined as a function of temperature time and type of masking agent material. The pattern size can be much finer than with screen printing methods, typically well below 100 µm. Selected parts of the masking agent layer can be heated or non-heated parts depending on the constituents of the copolymer and the method used to remove the selected parts. For instance, the non-heated parts of the masking agent layer can be removed to form openings in the masking agent layer to provide a grid mask.

Metallization is applied on the grid mask either by filling metallic seed material in the openings of the grid mask or by removing metallic material from the openings underlying the masking agent layer, so that metallic material below the grid mask layer can be used as seed grid for forming an electrically contactable grid on the substrate. Beneficially, this can be an inverse method for forming an electrically contactable grid. In this way, the proposed method proposes forming an electrically contactable grid either by providing a grid mask having openings defining a seed grid layer or by providing a grid mask being inverse to a seed grid layer for defining an electrically contactable grid. The electrical power generated in the solar cell can be output by wiring attached to the electrically contactable grid.

A cost efficient solar cell product can thus be achieved, reducing the amount of expensive metallic materials. Embodiments of the invention avoid deteriorating firing steps, but rather apply a gentle treatment to the semiconductor substrate, which reduces the scrap rate and enhances the reliability of the manufacturing process of the solar cell product. An electrically contactable grid is provided which allows for reduced dimensions. Shadowing effects due to unnecessarily large surface structures can be reduced. As a result, the power of the solar cell product can be increased.

One embodiment of the invention can further include depositing an antireflective layer on the surface of the substrate; depositing a conductive layer, such as at least one of titanium (Ti), titanium nitride (TiN), tantalum (Ta), tantalum nitride (TaN), copper (Cu) on the surface of the substrate; and, depositing a conductive layer, such as at least one of Ti, TiN, Ta, TaN, Cu on an antireflective layer deposited on the surface of the substrate. Therefore, prior to depositing a heat-sensitive masking agent layer on the surface of the substrate, either an antireflective layer or a conductive layer or a combination of antireflective layer arranged below a conductive layer can be deposited on the surface of the substrate. A heat-sensitive masking agent layer can subsequently be deposited on the antireflective layer or the conductive layer.

In this way, coating the heat-sensitive masking agent layer can be preceded by one of the aforementioned process steps. By depositing an antireflective layer or a conductive layer, which can be used as barrier and liner interlayer between substrate and metallic material of the contactable grid, a grid mask can be produced having an antireflective layer and/or conductive interlayer between substrate and grid mask layer. As such, after openings are formed in the masking agent layer, the antireflective layer material and/or a barrier and liner interlayer material is exposed in the openings. Thus, an additional separate step of depositing antireflective layer material or barrier and liner material in the openings can be avoided, which saves manufacturing time and avoids process failures.

In one embodiment, the masking agent includes a copolymer including two or more immiscible polymeric block components which can be separated into self-assembled phases by heating. The copolymer can be a block copolymer including at least a first and a second polymeric block component A and B being immiscible with each other. The block copolymer can contain any numbers of the polymeric block components A and B arranged in any optional manner. The block copolymer can be a linear diblock copolymer having the formula of A-B, or can have one of the following formulas:

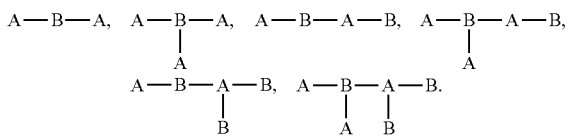

In general, the manner by which the masking agent layer is deposited onto the substrate is arbitrary and can be a widely used coating technique like spin coating, spray coating, or similar coating techniques. A wide range of copolymer types for different application fields are available, such that the small dimensions of the polymeric blocks can be beneficially used for this application. In one embodiment, one polymeric block component can have a micrometer chain size, and the other block polymeric block component, which may have a nanometer chain size. There are many different types of block copolymers that can be used for implementing this embodiment. So long as a block copolymer contains two or more different polymeric block components that are immiscible with each other, the two or more different polymeric block components are capable of separating into two ore more different phases and thus form patterns of isolated structural units under suitable conditions.

Using a copolymer as masking agent layer, one embodiment selects the copolymer from a group including: polystyrene-block-polymethylmethacrylate (PS-b-PMMA), polystyrene-block-polyisoprene (PS-b-PI), polystyrene-block-polybutadiene (PS-b-PBD), polystyrene-block-polyvinylpyridine (PS-b-PVP), polystyrene-block-polyethyleneoxide (PS-b-PEO), polystyrene-block-polyethylene (PS-b-PE), polystyrene-b-polyorganosilicate (PS-b-POS), polystyrene-block-polyferrocenyldimethylsilane (PS-b-PFS), polyethyleneoxide-block-polyisoprene (PEO-b-PI), polyethyleneoxide-block-polybutadiene (PEO-b-PBD), polyethyleneoxide-block-polymethylmethacrylate (PEO-b-PMMA), polyethyleneoxide-block-polyethylethylene (PEO-b-PEE), polybutadiene-block-polyvinylpyridine (PBD-b-PVP), and polyisoprene-block-polymethylmethacrylate (PI-b-PMMA).

In another embodiment, a thermoresist material is used as masking agent layer. A thermoresist is a polymer which links polymeric chains through thermal treatment. Such a thermoresist material, especially a thermoresist polymer, can also be deposited using a spin-coating, a spray-coating or a similar coating technique. The masking agent layer includes a thermally developable polymer resist or other kind of thermoresist material.

In one embodiment, local heating can be applied by using a heat stamp containing a structure of a desired grid mask, such by using a brand iron or a stamp consisting of or otherwise including a flexible stamp material, particularly a silicon rubber material, to transfer the polymer pattern directly onto the surface. For instance, the surface can be covered with a heat sensitive polymer and its pattern achieved using the heat stamp. Alternatively, the polymer pattern can be transferred using a soft stamp followed by curing the polymer by using UV irradiation or local heating. Stamping technologies can be used to apply structures due to time and cost-saving constraints.

Stamping represents a simple technique to transfer structures and thus has the advantage that the stamp itself can be used multiple times. This is beneficial for a series production. A flexible stamp material can be used to stamp structures on randomly curved substrate surfaces, permitting patterning of non-flat solar cells. Beneficially, the copolymer comprises two or more immiscible polymeric block components, such as PS and PMMA, and the copolymer separates in areas which are heated by contact with the heat stamp. The heat stamp can include a first polymeric block component such as PS. Areas which have not been in contact with the heat stamp and which consequently are not heated can include another polymeric block component such as PMMA.

In one embodiment, removing the selected parts of the masking agent layer can be performed by selectively etching the selected parts of the masking agent layer until openings are formed penetrating mask agent layer for forming a grid mask. In this way, the openings can reach the surface of the substrate where the substrate is not coated. The openings can alternatively reach an antireflective layer where the substrate is coated with an antireflective layer. The openings can further alternatively reach a conductive layer where the substrate is coated with a conductive layer, such as a conductive layer on top of an antireflective layer.

The opening can be formed by selectively etching and removing the phase-separated, non-heated parts of the copolymer, such as the PMMA areas formed by the heat stamp. As such, the heated areas, such as those formed by PS, remain on the substrate. Alternatively, a thermoresist polymer can be applied. Similar to a photoresist that is patterned by local irradiation with light, a thermoresist can be patterned by local heating. In the thermoresist polymer, non-heated and thermally developed parts can be developed and etched.

In another embodiment, removing the selected parts of the masking agent layer can be achieved by also trimming remaining parts of the grid mask, such as by using a reactive ion etching technique to reduce the contact grid width. Trimming of the remaining parts of the grid mask permits creation of finer grid mask structures for producing contactable grid structures of reduced width. In this way, trimming as an additional step after removing the selected parts of the mask agent layer can provide a finer structured grid mask for creating a highly detailed contacting grid of the solar cell. This further reduces shadowing effects and enhances power efficiency of the solar cell.

In another embodiment, removing the selected parts of the masking agent layer can be achieved by selectively removing parts of one or more layers being accessible through openings in the grid mask and removing of the grid mask, such as by etching of the remaining parts of the masking agent layer. Such etching may include chemical-mechanical polishing (CMP). Removing non-heated parts of the masking agent layer can particularly be followed by one of the steps of removing the one or more additional layers covering the substrate layer in the area being accessible through the openings of the grid mask.

For instance, the non-heated parts may particularly be removed after selectively removing of parts of the antireflective layer or parts of the conductive layer being accessible through the openings of the grid mask. Thereafter, the grid mask is itself removed, such as by a polishing technique as CMP. The seed layer, such as nickel (Ni), is arranged below the contact metal to secure a better contact resistance and prevent copper (Cu) from migrating, such as via electromigration, into the silicon substrate. A suitable passivation layer may be an electrically non-conducting material, such as silicon nitride (SiN) or silicon monoxide (SiO).

In another embodiment of the invention, applying a contact metallization can be preceded by depositing a passivation layer, such as SiN, on the grid mask. SiN is known as a liner and passivation material that is used to separate a contact material, such as Cu, against the semiconductor substrate, particularly a silicon substrate. Therefore, it is beneficial to deposit a passivation layer, such as SiN, before depositing a metallic layer, such as Cu, on the substrate. The passivation layer can serve as self-passivation mechanism and helps bounding and separating of contact material from the substrate. The passivation layer can be deposited by PVD (Physical Vapor Deposition), such as sputtering or evaporation, or CVD (Chemical Vapor Deposition).

In another embodiment, applying a contact metallization can include depositing a seed layer like nickel (Ni) and/or palladium (Pd) to provide a seed grid defined by the openings of the grid mask. The seed layer can be deposited by PVD, CVD, screen printing, squeegee, or stamping. The seed layer can serve as a basis for growing a metallization on the substrate, by using an electroless plating or electroplating process to grow a contacting grid material on the seed layer.

In another embodiment, applying contact metallization can include a removing the metalized grid mask, such as by etching using a CMP technique, thus leaving a contactable seed grid the substrate. That is, this embodiment includes, after depositing a seed layer on a grid mask, removing the grid mask with the deposited parts of the metallic seed layer covering the grid mask area. As such, parts of the seed layer remain placed in the openings of the grid mask on the substrate in an untouched manner. In this way, the metalized grid mask parts can be removed, such that a contactable seed grid on the substrate defined by the openings of the grid mask remains.

In another embodiment, applying contact metallization using a conductive interlayer on an antireflective layer can include firing the remaining parts of the conductive interlayer to contact the substrate through the antireflective layer, in order to provide a seed grid being inverse to the grid mask. According to this embodiment, and as an alternative to the aforementioned metallization by removing a metalized grid mask, a metallic seed grid can be provided that is inverse to the grid mask. This is achieved by removing the grid mask, exposing the underlying parts of a conductive layer that was formerly protected by the grid mask. The exposed conductive layer can thus serve as seed grid on the substrate.

In another embodiment, applying contact metallization can include subsequently plating a contact material on top of the seed grid. Where parts of a conductive interlayer remain in the openings of the seed grid, the parts of the conductive layer accessible through openings of the seed grid are removed, such as by selectively etching the conductive interlayer parts. It is beneficial to plate the contact material on the seed grid using an electroless or an electrode plating technique, where the contact material may be copper. Where a conductive interlayer was deposited under the masking agent layer, the parts of the conductive layer accessible through the openings of the seed grid can be removed, such as by using a selective etching technique such as RIE (Reactive Iron Etching) or other techniques. Such techniques remove the remaining parts of the conductive interlayer between the seed grid area.

In one embodiment of the invention, a solar cell product is provided. The solar cell product includes a semiconductor substrate with an electrically contactable grid on at least one side of the substrate. The grid is manufactured in accordance with any approach that has been described above.

FIGS. 1a and 1b display in a comparative diagram the difference between a conventional lithography method in FIG. 1a, with the steps CL-S1 to CL-S3 being used for manufacturing electrically contactable grids on a solar cell product, in comparison to an embodiment of the invention including the steps SA-S1 to SA-S3, in FIG. 1b. A conventional lithography method includes the step CL-S1 of depositing a photoresist layer PR on a substrate 14. The conventional method further includes the step CL-S2 of exposing the photoresist layer PR to ultraviolet (UV) light, where a photo mask MA (usually a plastic or metal foil with an imprinted inverse structure of the mask) is used. The conventional method also includes the step CL-S3 of developing the resist to form a grid mask, where openings in the photoresist layer PR permit subsequent deposition on and metallization of selected areas of the substrate 14.

In contrast thereto, a first embodiment of the inventive method illustrated in FIG. 1b includes the step SA-S1 of depositing a heat-sensitive masking agent 16 to the substrate 14. The substrate may be covered with a barrier layer 24 to form an interlayer. The inventive method of the embodiment of FIG. 1b also includes a local heat treatment step SA-S2 of selectively heating of the heat-sensitive masking agent 16 to pattern the masking agent layer 16 into heated parts 26 and non-heated parts 28. The inventive method of FIG. 1B further includes a step SA-S3 of removing the non-heated parts 28 so that openings 46 are formed which give access to the layer 24, and so that heated parts 26 remain as parts 48 masking the substrate 14. In this way, a grid mask 30 is provided that permits a conductive material to be deposited on the substrate 14 (indicated by parallel arrows pointing towards the substrate 14) through the openings 46 of the grid mask 30, usually by a PVD or CVD technique.

Figure 2:
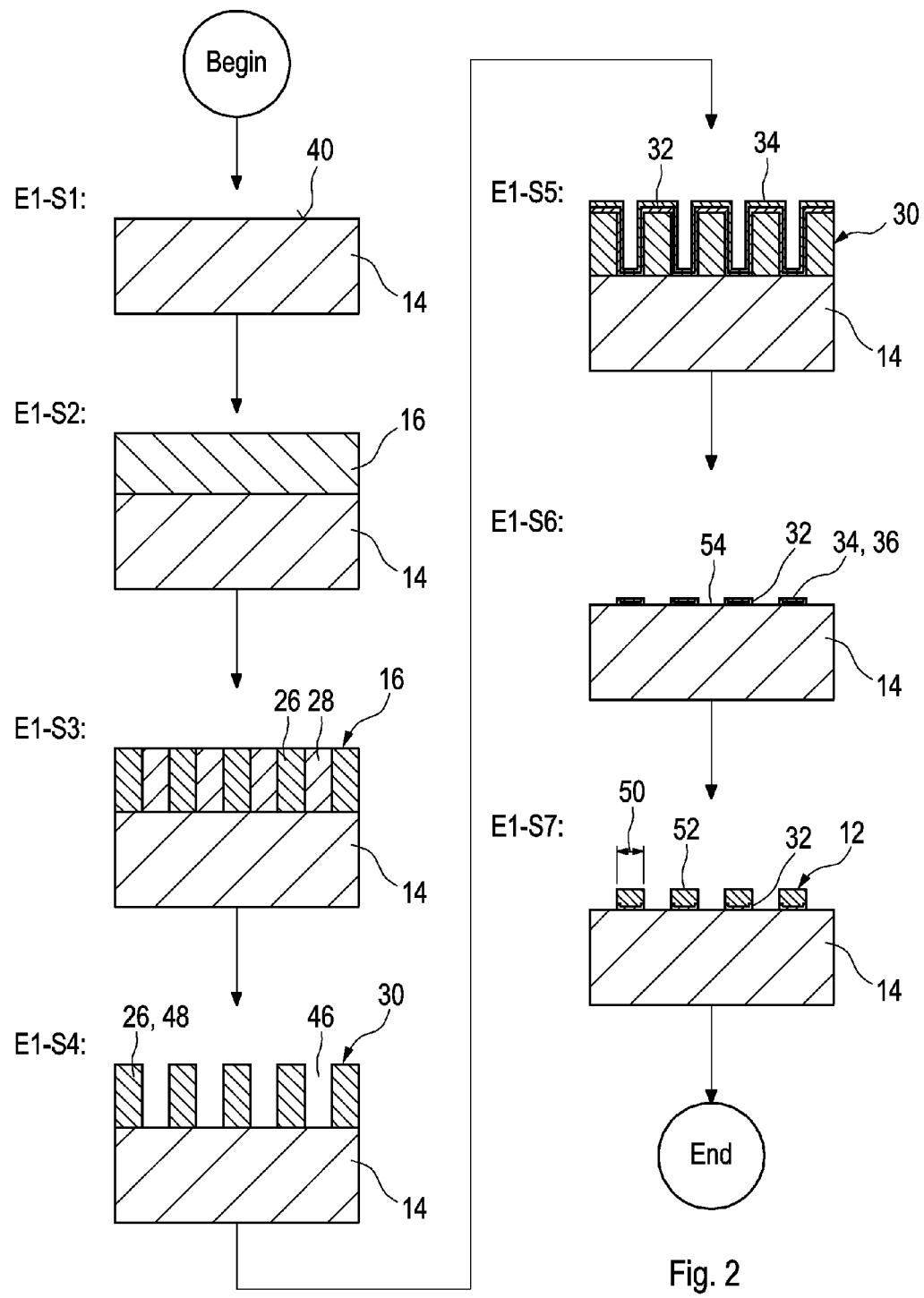
FIG. 2 is a diagram schematically depicting process steps, according to a first embodiment of the invention.

FIG. 2 shows a sequence of a first embodiment of the inventive method including the following. Step E1-S1 starts from a substrate 14, such as a semiconductor silicon substrate 14 which was prepared with a p-n junction to form a photoactive diode of a solar cell. In step E1-S2 a copolymer is deposited on the substrate surface 40 by a spin coating, spray coating, or other appropriate coating technique. In one embodiment, the copolymer includes at least two immiscible, thermally separable constituents, such as PS and PMMA. This copolymer constitutes a masking agent layer 16 coating the substrate 14.

Step E1-S3 depicts a heat treatment to form heated parts 26 and non-heated parts 28 in the masking agent layer 16 on the substrate 14, particularly by pressing a patterned heat stamp (not shown) onto the copolymer layer 16. In step E1-S4 non-heated parts 28 of the masking agent layer 16 are removed by etching to form a grid mask 30, such as by an ion etching technique or another etching technique. The result is the formation of openings 46 in the grid mask 30, so that parts 48 remain and formerly non-heated parts 28 are removed from the mask agent layer 16 to form the grid mask 30.

The following step E1-S5 is characterized by depositing layers 32, 34 by PVD or CVD, such that a passivation layer 32, such as SiN, and a seed layer 34, such as Ni and/or Pd, are deposited on the grid mask 30 and in the openings 46 of the grid mask 30 of the substrate 14. In the course of the following step E1-S6 the metalized grid mask 30 is etched, so that a seed grid 36 remains on substrate 14, including portions that include passivation layer 32 covered with seed layer 34 separated by uncoated areas 54. Etching can be performed by using CMP (Chemical Mechanical Polishing) which is a favorable low-down force process which leaves the side walls in the openings 46. For instance, selective etching might be used.

The result of this process renders the structure of the seed grid 36 unique, in which a standing structure has a SiN-based side wall (forming a cup-like structure with passivation layer 32 at the outside and seed layer 34 at the inside. The deposition of contact material 52, such as by plating, fills the "cup" and makes it look much like a muffin or bread loaf. Cu or Ni can be used as contact material. Ni may afterwards be electroless deposited because it will not plate. However, Cu will plate, which is structurally protected by SiN by self-passivation. The electroless Cu plating may need an alcohol rinse to remove typical residuals of benzotriazole (BTA) from the Cu surface and that resulting from CMP. The BTA contamination beneficially inhibits corrosion of the Cu surface before the next process step.

Final step E1-S7 includes an electroless plating of the contact material 52, such as Cu, on top of seed grid 36 to form an electrically contactable grid 12. The grid 12 has a contact grid width 50 defined by the dimensions of the metal spots of the seed grid 36 on the substrate 14. The stack of the contact area may be a thin Pd layer covered with a thin Ni layer with a thick Cu layer as contact material. A stack of Pd and Ni is an effective barrier against Cu migration into the substrate with a good adhesion to the substrate, and provides a beneficial low contact resistance.

Figure 3:
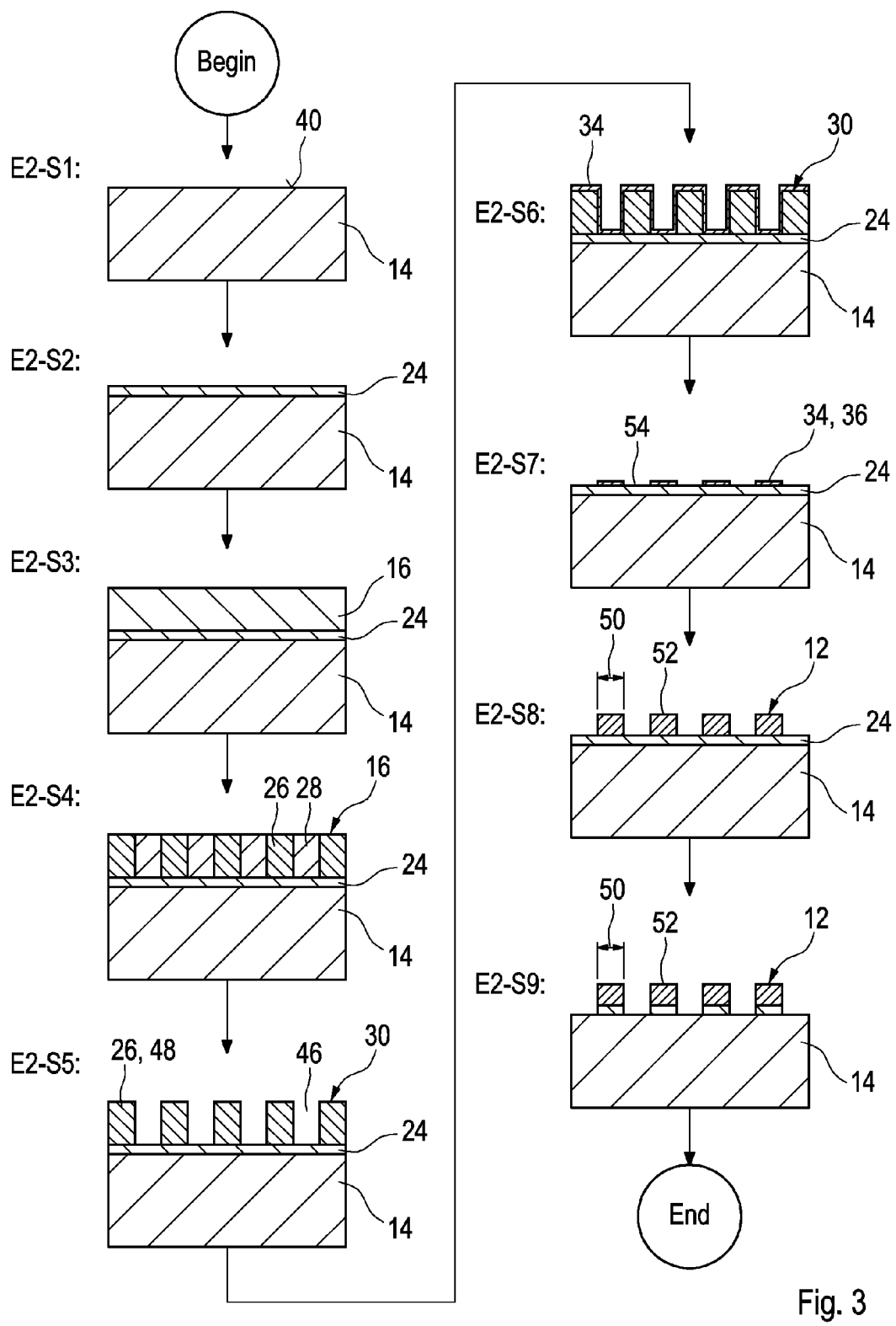
FIG. 3 is a diagram schematically depicting process steps, according to a second embodiment of the invention.

Referring now to FIG. 3, a schematic view of a second embodiment of the inventive method is shown. Step E2-S1 also starts from a substrate 14, such as a semiconductor silicon substrate 14 that was prepared with a p-n junction to form a photoactive diode of a solar cell. In step E2-S2 a conductive barrier layer 24, such as titanium (Ti), titanium nitride (TiN), tantalum (Ta) or tantalum nitride (TaN), as a barrier and liner and also as a conductive intermediate layer 24, is deposited onto the substrate surface 40. In step E2-S3, a masking agent layer 16, such as a copolymer including PMMA (polymethylmethacrylate) and PS (polystyrene), is deposited onto the layer 24. The layer 24 includes electrically conductive material that is arranged on the substrate 14.

Local heating in step E2-S4, such as by using a patterned heat stamp, forms heated parts 26 and non-heated parts 28 in the masking agent layer 16. The copolymer separates into heated areas (heated parts 26) containing mainly PS, and non-heated areas (non-heated parts 28) containing mainly PMMA. In step E2-S5 non-heated parts 28 containing mainly PMMA are removed such as by etching. By comparison, the heated parts 26, containing mainly PS, remain as remaining parts 48. By removing the non-heated parts 28, openings 46 are formed in the masking agent layer 16, which permits access to selected areas of the layer 24. Openings 46 and remaining parts 48 form the grid mask 30.

In step E2-S6 a seed layer 34 like Ni and/or Pd is deposited, such as by PVD or CVD, but can also be deposited through a plating process. The seed layer 34 covers the remaining parts 48 and the free space in the openings 46 of the grid mask 30, which is separated from the substrate 14 by the layer 24. In the following step E2-S7, the metalized grid mask 30 is etched so that a metallic seed grid 36 remains. The seed grid 36 is formed by the portions of the seed layer 34 deposited in the openings 46 of the grid mask 30, and the seed grid 36 is interconnected to each other by the underlying layer 24.

In step E2-S8 the seed grid 36 can be electroplated by an electroless or electroplating technique to form electrically contactable grid 12. In final step E2-S9 the interconnecting parts of the layer 24 are removed by an etching process, such as a selective etching process. The contactable grid 12 has a contact grid width 50 defined by the dimensions of the metal spots of the seed grid 36 on the substrate 14.

Figure 4:
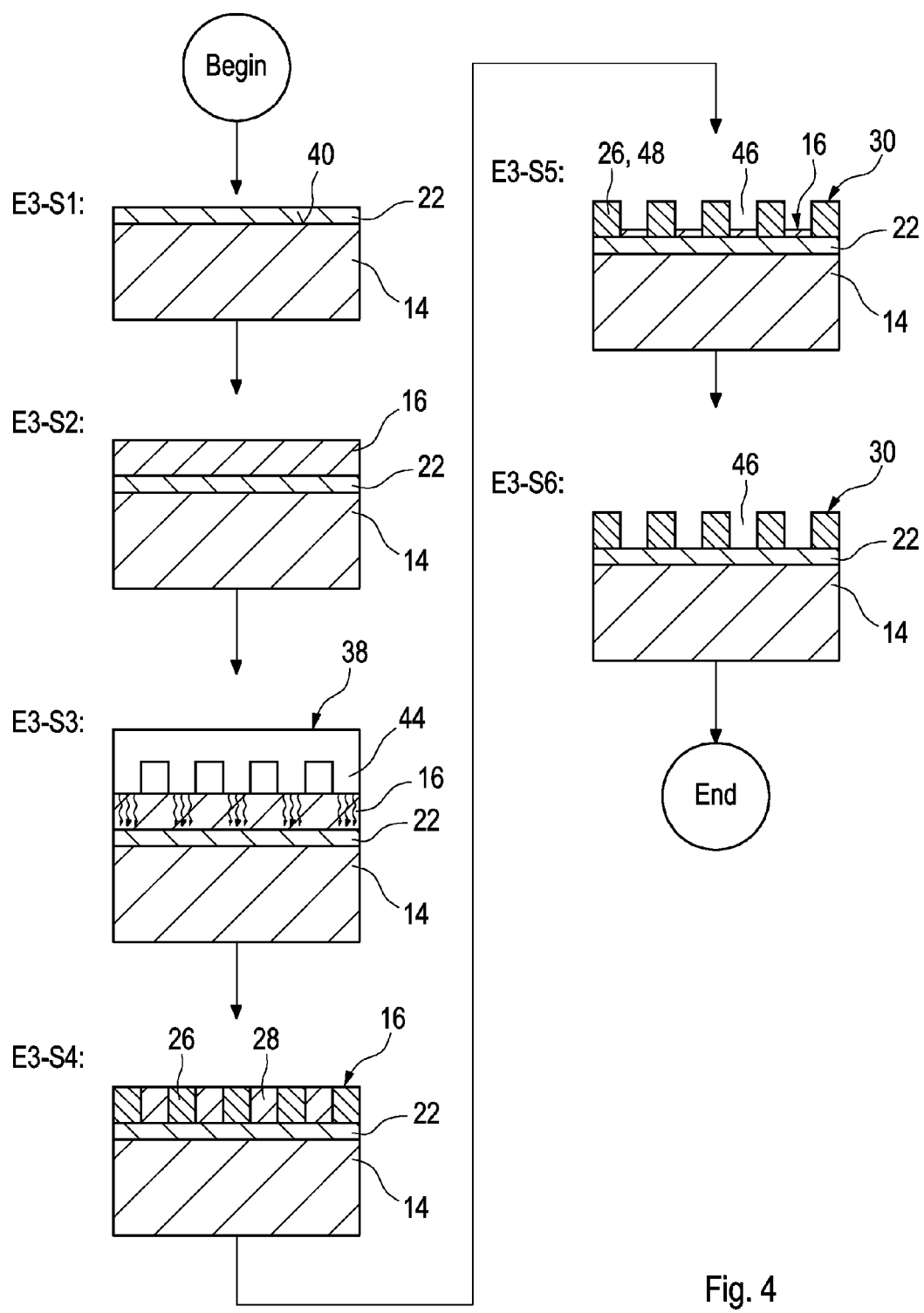
FIG. 4 is a diagram schematically depicting process sub-steps for providing a grid mask, according to a third embodiment of the invention.

FIG. 4 depicts sub-steps of a third embodiment of the inventive method for forming a grid mask 30. Starting from an initial step E3-S1, a substrate 14, such as a semiconductor silicon substrate 14 that was prepared with a p-n junction to form a photoactive diode of a solar cell, is coated with an antireflective layer 22. During the next step E3-S2 the antireflective layer 22 is coated by a masking agent layer 16. This masking agent layer 16 can include a copolymer (as described in the embodiment above) or a thermoresist material, the latter which can be deposited by spin coating, spray coating and the like.

The structuring in step E3-S3 is performed by a so-called heat stamping technique using a kind of heated "brand iron" as heat stamp 38. By pressing the patterned heat stamp 38 on the masking agent layer 16, heated areas 26 and non-heated areas 28 of the masking agent layer 16 are formed, as is shown in step E3-S4. The following step E3-S5 includes an etching procedure for removing selected areas, specifically non-heated areas 28 of a copolymer masking agent layer 16. Step E3-S5 can alternatively include developing a thermoresist masking agent layer 16 to form openings 46 in masking agent layer 16 in order to form a grid mask 30.

Where residuals of the masking agent layer 16 still remain in the openings 46, the next step E3-S6 removes the remaining parts of unheated copolymer or undeveloped resist of the masking agent layer 16 in the openings 46 via a selective etching process. In this way, a copolymer or thermoresist grid mask 30 is formed on the surface of the antireflective layer 22. The structure is printed onto the surface of the antireflective layer 22 by way of the heat stamp 38, which contains the structure 44 to be transferred.

Figure 7:
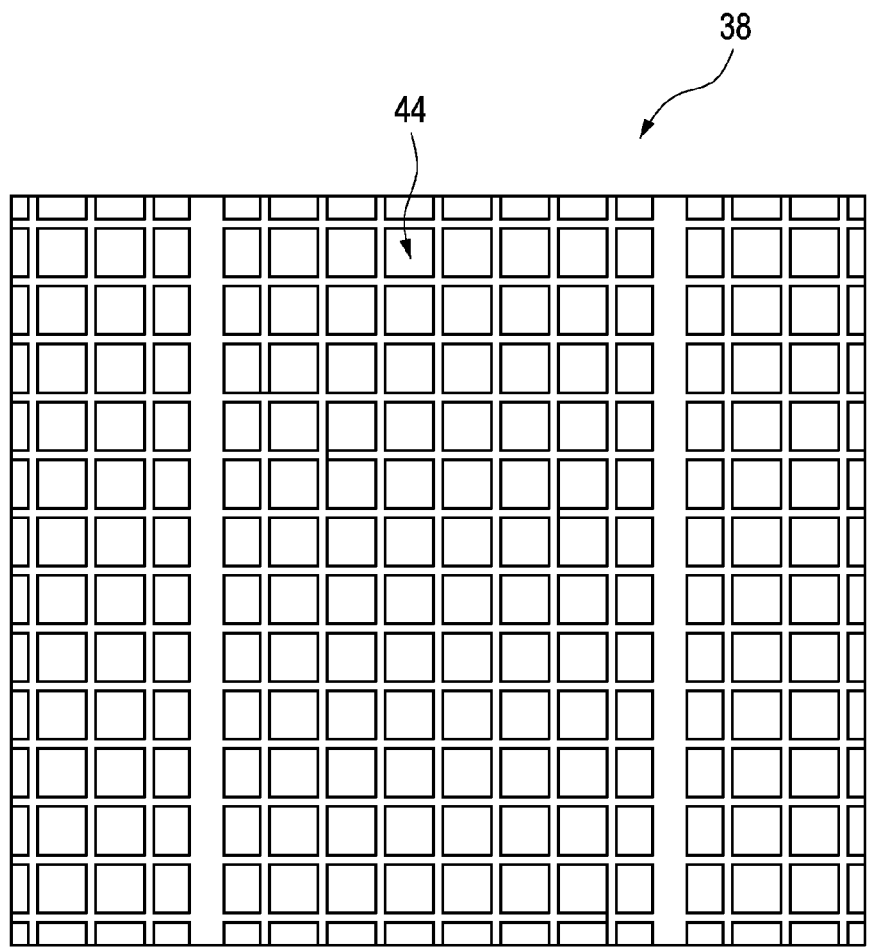
FIGS. 7a and 7b are diagrams schematically depicting a structure of a stamping iron for structuring a grid mask in a top view, in FIG. 7a, and in a side view, in FIG. 7b, according to an embodiment of the invention.
Figure 7:
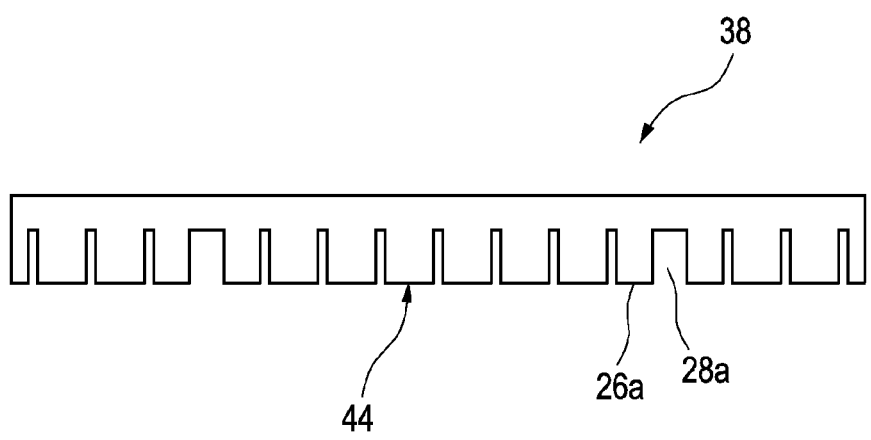

An example of such a heat stamp 38 according to an embodiment of the invention is schematically shown in FIG. 7. The structure of the grid mask 30 is realized using regular development or etching of grid mask openings 46. The heated areas 26 of the copolymer or thermoresist masking agent layer 16 can be cured. Where a thermoresist is used as the mask agent layer 16, the developing process reduces the non-heated areas 28 and provides contact openings 46; the heated areas 26 of the thermoresist can then be cured. Etching removes the copolymer or thermoresist remaining from the non-heated areas 28 (step E3-S5) as well as some material from the heated and eventually cured areas 26.

Figure 5:
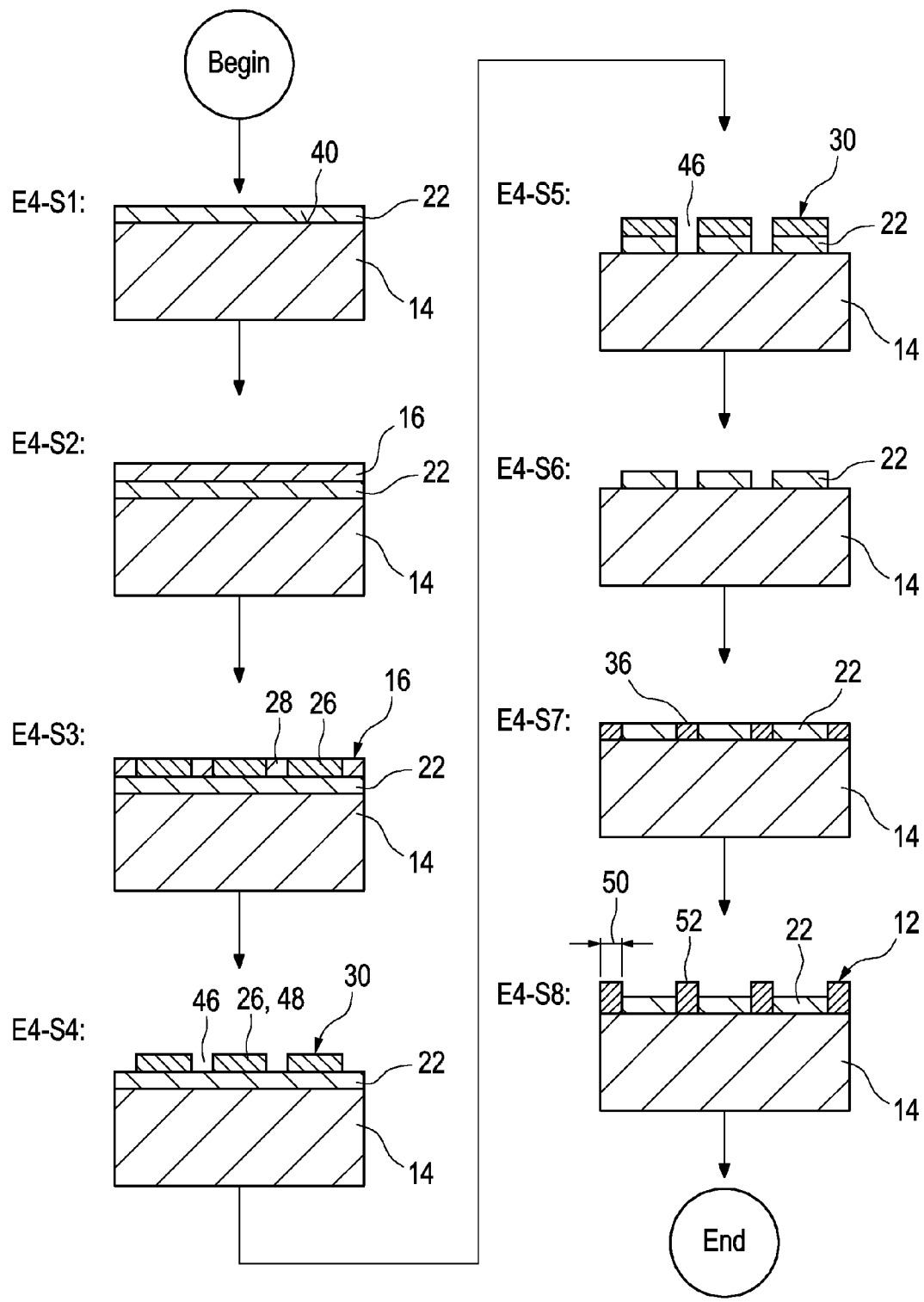
FIG. 5 is a diagram schematically depicting process steps, according to a fourth embodiment of the invention.

FIG. 5 shows a fourth embodiment of the inventive method starting with step E4-S1, in which a substrate 14, such as a semiconductor silicon substrate 14 that was prepared with a p-n junction to form a photoactive diode of a solar cell, is coated with an antireflective layer 22 on the substrate surface 40. A masking agent layer 16 in form of a copolymer is deposited, such as by using a spin-on technique, in step E4-S2. By a local heat treatment in step E4-S3, heated part areas 26 and non-heated part areas 28 are structured in masking agent layer 16 so that in step E4-S4 non-heated parts 28 can be removed by selective etching of the polymer to generate structured openings 46 in the masking agent layer 16, such that parts 48 remain. Thus, in step E4-S4 a grid mask 30 is formed.

Thereafter, in step E4-S5 parts of the antireflective layer 22 accessible through the openings 46 of the grid mask 30 are etched to reach the surface 40 of the silicon substrate 14. Afterwards, in step E4-S6 the grid mask 30 is removed by etching of the heated parts 48 of grid mask polymer 30, so that in step E4-S7 metal is deposited in the openings 46, such as by using a squeegee technique, by electroplating, or by stamping, to form a seed grid 36. During final step E4-S8 seed grid 36 within the antireflective layer 22 serves as basis for growing a grid metallization like Ni and/or Pd, by using an electroless or electroplating technique to form an electrically contactable grid 12. Depositing the contact material 52 onto the seed grid 36 results in an electrically contactable grid 12. The contact grid width 50 of the electrically contactable grid 12 is determined by the dimensions of the metal spots of the seed grid 36.

Therefore, the surface to be structured is coated with a copolymer (or a thermoresist), where a structure is printed into the surface using a heat treatment step E4-S3. After removing non-heated parts 28, the open contact holes 46 are filled with seed layer material in step E4-S7 to secure optimal contact to silicon surface 40. On top of the seed grid 36, contact material such as Cu is plated to form an electrically contactable grid 12.

Figure 6:
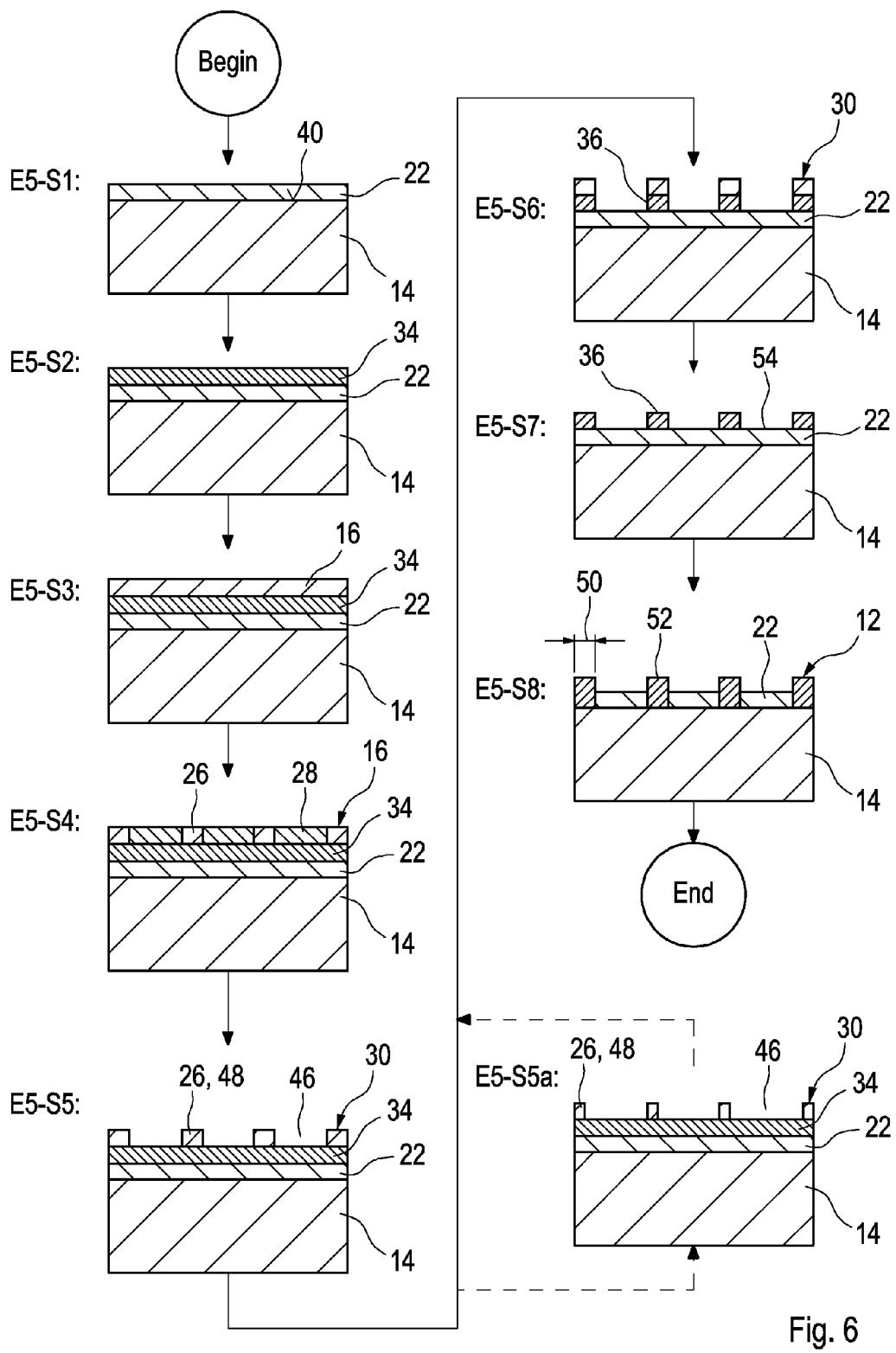
FIG. 6 is a diagram schematically depicting process steps, according to a sixth embodiment of the invention.

FIG. 6 depicts another embodiment of the inventive method. In step E5-S1 the method starts with a substrate 14, such as a semiconductor silicon substrate 14 that was prepared with a p-n junction to form a photoactive diode of a solar cell, and that is coated by an antireflective layer 22 on its substrate surface 40. The antireflective layer 22 is deposited using a technique like spray coating, spin coating, or the like. In step E5-S2 a seed layer 34 is deposited onto the antireflective layer 22. On top of the seed layer 34 a masking agent layer 16 is deposited in step E5-S3 so that local heat treatment in step E5-S4 forms heated parts 26 and non-heated parts 28 in mask agent layer 16. During the following step E5-S5 non-heated parts 28 are removed to form openings 46 in grid mask 30, by removing material from masking agent layer 16.

As a result, remaining parts 48 cover the seed layer 34 to form a grid mask 30. Step E5-S5A can be performed so that the grid mask 30 is trimmed by narrowing down the contact wire width of the remaining parts 48 according to a specified current density, particularly by using a selective etching process that selectively etches the remaining parts 48. This type of trimming step can also be applied in the other described embodiments. A following step E5-S6 includes etching of the seed layer 34 in the openings 46 of the grid mask 30 to remove conductive material from the openings 46 of grid mask 30.

In the course of step E5-S7, grid mask 30 is etched using a polymer etching technique to selectively remove grid mask 30 from seed grid 36. In final step E5-S8 two interacting steps are in actuality performed. First, seed grid 36 is fired to contact the substrate surface through the antireflective layer 22. That is, when heated, metal of the seed grid 36 diffuses through the antireflective layer 22, making contact with the substrate 14. Second, contact material 52 is plated onto the metal spots of the seed grid 36 to form an electrically contactable grid 12.

FIGS. 7a and 7b depict a top view and a side view of a heat stamp 38 that can be used in the course of one or more embodiments of the inventive method. A structure 44 of the heat stamp 38 can be transferred to a masking agent layer 16, which as a result forms heated parts 26 from non-heated parts 28 in the masking agent layer. The structure of the grid mask 30 can be realized using regular developing and etching for structure opening. The heat stamp 38 can be made of a metal with a sufficient temperature coefficient. The heat is transferred to the stamp tips 26a, which are separated by recesses 28a that correspond to the stamp design reflected by the stamp structure 44.

The heat stamp 38 can be made out of a metal bulk material transferring the negative structure 44 onto the stamp using existing structuring techniques. The structure 44 can also be realized through normal mechanical treatment of the heat stamp 38. Alternatively, a flexible stamp material, such as a silicon rubber blanket, can be used to provide a flexible blanket for ribboned or non-planar photovoltaic cells. The structuring outlined above can be used within semiconductor fabrication, solar cell production, as well as in nanotechnology processing methods or the like. A metal stamp can be used multiple times without the need for maintenance or cleaning.

Figure 8:
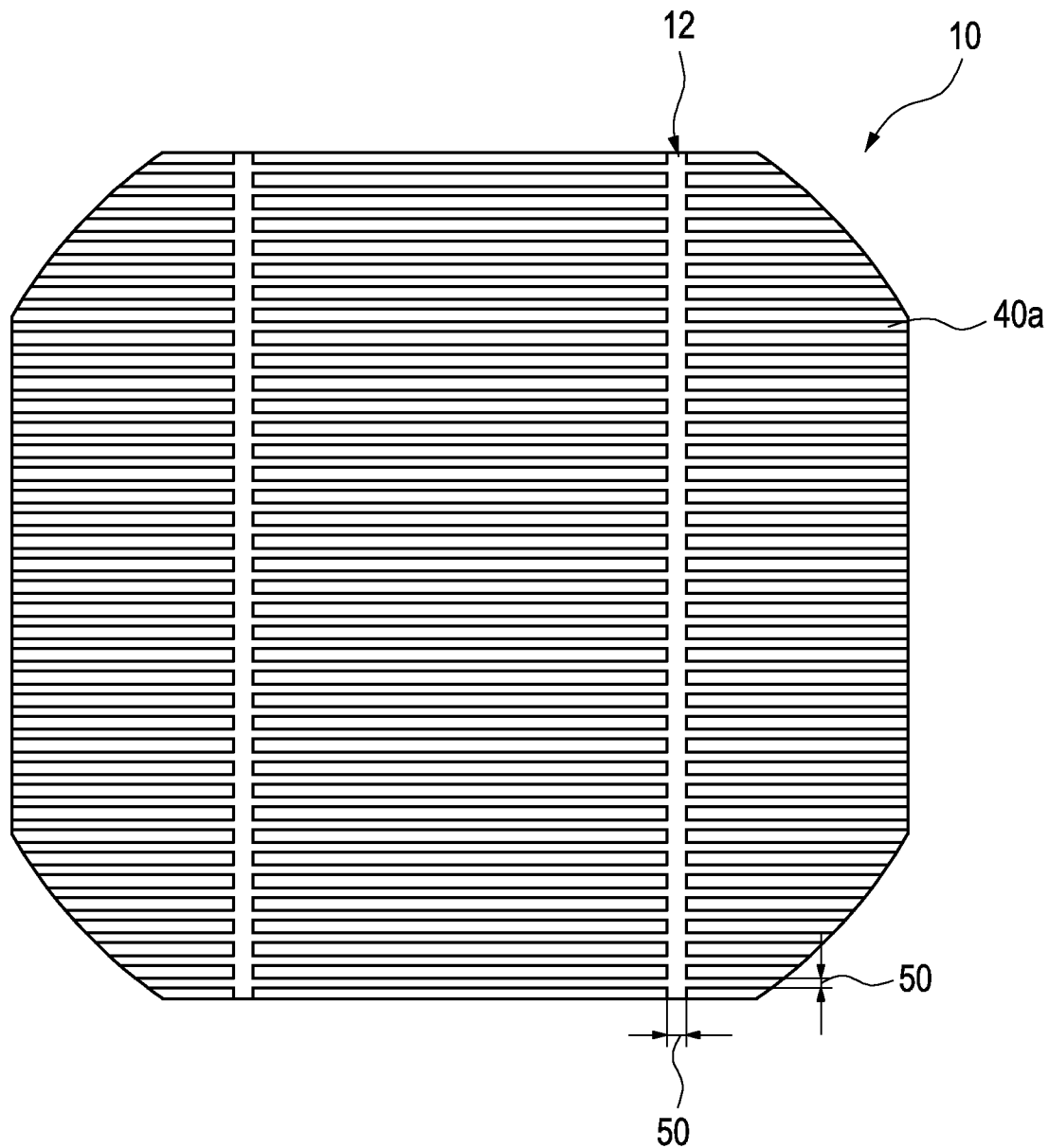
FIG. 8 is a diagram of a solar cell product, according to an embodiment of the invention.

FIG. 8 finally shows a front surface of a solar cell 10 being coated by a electrically contactable grid 12 with a contact grid 12 having fingers and stripes of a specific contact grid width 50. Between the contact grid 12, the photoactive substrate surface 40 is coated with an antireflective layer and is exposed to sunlight for producing electricity between a back electrode (not shown) and the electrically contactable grid 12.

The inventive methods can provide a contactable grid having double current densities enabling to trim the wire width by 25% and reduces some light shadowing. The enhanced methods to produce an electrically contactable grid are cost-competitive to common processes and can substitute for conventional screen printing processes, which are expensive and consume large amounts of material. The contact grid layer can be structured by using dedicated heat stamps to selectively transfer of heat to the surface of a masking agent layer. The structuring of the surface does not require lithography and uses a heat stamp instead, in form of a kind of "brand iron", for small-scale structuring, such as semiconductor, solar, and nanotechnology applications.

The contact grid size can be reduced compared to screen printing techniques, resulting in a reduction of shadowing effects and in the enhancement of the efficiency of the solar cell. Heat stamps are long lasting devices. A stamp can be easily manufactured and applied. Structuring immiscible copolymers using a stamping technique as described herein is cost-effective, where heat stamps can be loaded using simple heating plates. Such structuring via stamps further minimizes process variation, which provides for good yield particularly in series production. The trimming ability of the grid mask permits optimization of the current density of grid wiring of a solar cell and reduces shadowing. An additional firing is usually not needed, resulting in less degradation throughout the manufacturing process.

It is noted that, although specific embodiments have been illustrated and described herein, it will be appreciated by those of ordinary skill in the art that any arrangement calculated to achieve the same purpose may be substituted for the specific embodiments shown. This application is thus intended to cover any adaptations or variations of embodiments of the present invention. As such and therefore, it is manifestly intended that this invention be limited only by the claims and equivalents thereof.

What is claimed is:

1. A method for manufacturing one or more electrically contactable grids on a surface of a semiconductor substrate for use in a solar cell product, comprising:
   depositing a heat-sensitive masking agent layer on the surface of the semiconductor substrate of the solar cell product;
   locally heating said masking agent layer to form a grid mask;
   removing selected parts of the masking agent layer defined by local heating to form openings in said grid mask; and,
   applying contact metallization on said grid mask,
   wherein locally heating comprises using a patterned heat stamp containing a structure of the grid mask.

2. The method according to claim 1, further comprising one of:
   depositing an antireflective layer on the surface of the semiconductor substrate;
   depositing a conductive layer, comprising at least one of Ti, TiN, Ta, TaN, Cu, on the surface of the semiconductor substrate;
   depositing a conductive layer, comprising at least one of Ti, TiN, Ta, TaN, Cu, on an antireflective layer deposited on the surface of the semiconductor substrate.

3. The method according to claim 1, wherein the masking agent includes a copolymer comprising two or more immiscible polymeric block components which can be separated into self assembled phases by heating,
   and wherein the copolymer is a block copolymer comprising at least a first and a second polymeric block component A and B being immiscible with each other such that the block copolymer contains any numbers of the polymeric block components A and B arranged in any manner.

4. The method according to claim 3, wherein the copolymer is selected from a group comprising polystyrene-block-polymethylmethacrylate (PS-b-PMMA), polystyrene-block-polyisoprene (PS-b-PI), polystyrene-block-polybutadiene (PS-b-PBD), polystyrene-block-polyvinylpyridine (PS-b-PVP), polystyrene-block-polyethyleneoxide (PS-b-PEO), polystyrene-block-polyethylene (PS-b-PE), polystyrene-b-polyorganosilicate (PS-b-POS), polystyrene-block-polyferrocenyldimethylsilane (PS-b-PFS), polyethyleneoxide-block-polyisoprene (PEO-b-PI), polyethyleneoxide-block-polybutadiene (PEO-b-PBD), polyethyleneoxide-block-polymethylmethacrylate (PEO-b-PMMA), polyethyleneoxide-block-polyethylethylene (PEO-b-PEE), polybutadiene-block-polyvinylpyridine (PBD-b-PVP), and polyisoprene-block-polymethylmethacrylate (PI-b-PMMA).

5. The method according to claim 1, wherein the masking agent layer is a thermoresist material.

6. The method according to claim 1, wherein removing the selected parts of the masking agent layer comprises selectively etching the selected parts of the masking agent layer until openings are formed penetrating masking agent layer.

7. The method according to claim 1, further comprising, after removing the selected parts of the masking agent layer, trimming the grid mask by a reactive-ion-etching technique to reduce an area where the masking agent layer contacts the grid mask.

8. The method according to claim 1, wherein removing the selected parts of the masking agent layer comprises:
- selectively removing first parts of the masking agent layer accessible through openings in the grid mask; and,
- removing the grid mask, by etching second parts of the masking agent layer that remain after the first parts have been removed, using a chemical mechanical polishing technique.

9. The method according to claim 1, wherein further comprising, prior to applying the contact metallization, depositing a passivation layer on said grid mask, the passivation layer comprising SiN and/or SiO.

10. The method according to claim 1, wherein applying the contact metallization comprises depositing a seed layer comprising Ni and/or Pd, to provide a seed grid defined by the openings of the grid mask.

11. The method according to claim 10, wherein applying the contact metallization further comprises removing the grid mask, by etching, such that a contactable seed grid remains on the semiconductor substrate.

12. The method according to claim 2, wherein removing the selected parts of the masking agent layer comprises:
- selectively removing first parts of the masking agent layer accessible through openings in the grid mask; and,
- removing the grid mask, by etching second parts of the masking agent layer that remain after the first parts have been removed, using a chemical mechanical polishing technique,
- and wherein applying the contact metallization using the conductive layer on the antireflective layer comprises firing the conductive layer to contact the semiconductor substrate through the antireflective layer to provide a seed grid being inverse to the grid mask.

13. A method for manufacturing one or more electrically contactable grids on a surface of a semiconductor substrate for use in a solar cell product, comprising:
- depositing a heat-sensitive masking agent layer on the surface of the semiconductor substrate of the solar cell product;
- locally heating said masking agent layer to form a grid mask;
- removing selected parts of the masking agent layer defined by local heating to form openings in said grid mask; and,
- applying contact metallization on said grid mask,
- wherein applying the contact metallization comprises:
  - depositing a seed layer to provide a seed grid defined by the openings of the grid mask;
  - plating contact material on top of metal spots of the seed grid; and,
  - removing the contact material plated within openings of the seed grid, by selectively etching the contact material plated within the openings of the seed grid.

14. A method for manufacturing one or more electrically contactable grids on a surface of a semiconductor substrate for use in a solar cell product, comprising:
- depositing a heat-sensitive masking agent layer on the surface of the semiconductor substrate of the solar cell product;
- locally heating said masking agent layer to form a grid mask, by using a patterned heat stamp containing a structure of the grid mask;
- removing selected parts of the masking agent layer defined by local heating to form openings in said grid mask;
- applying contact metallization on said grid mask;
- one of:
  - depositing an antireflective layer on the surface of the semiconductor substrate;
  - depositing a conductive layer on the surface of the semiconductor substrate;
  - depositing a conductive layer on an antireflective layer deposited on the surface of the semiconductor substrate,
- wherein the masking agent includes a copolymer comprising two or more immiscible polymeric block components which can be separated into self assembled phases by heating,
- and wherein the copolymer is a block copolymer comprising at least a first and a second polymeric block component A and B being immiscible with each other such that the block copolymer contains any numbers of the polymeric block components A and B arranged in any manner.

15. The method of claim 14, wherein removing the selected parts of the masking agent layer comprises selectively etching the selected parts of the masking agent layer until openings are formed penetrating masking agent layer.

16. The method of claim 14, further comprising, after removing the selected parts of the masking agent layer, trimming the grid mask by a reactive-ion-etching technique to reduce an area where the masking agent layer contacts the grid mask.

17. The method of claim 14, wherein removing the selected parts of the masking agent layer comprises:
- selectively removing first parts of the masking agent layer accessible through openings in the grid mask; and,
- removing the grid mask, by etching second parts of the masking agent layer that remain after the first parts have been removed, using a chemical mechanical polishing technique.

18. The method of claim 14, wherein removing the selected parts of the masking agent layer comprises:
- selectively removing first parts of the masking agent layer accessible through openings in the grid mask; and,
- removing the grid mask, by etching the second parts of the masking agent layer that remain after the first parts have been removed, using a chemical mechanical polishing technique,
- and wherein applying the contact metallization using the conductive layer on the antireflective layer comprises firing the conductive layer to contact the semiconductor substrate through the antireflective layer to provide a seed grid being inverse to the grid mask.

* * * * *